(12) United States Patent  
Bertrand et al.

(10) Patent No.: US 12,376,502 B2  
(45) Date of Patent: Jul. 29, 2025

(54) ARRAY OF QUANTUM DOTS WITH SPIN QUBITS

(71) Applicants: Commissariat à l'Énergie Atomique et aux Énergies Alternatives, Paris (FR); Centre National de la Recherche Scientifique, Paris (FR)

(72) Inventors: Benoit Bertrand, Grenoble (FR); Tristan Meunier, Grenoble (FR); Pierre-André Mortemousque, Grenoble (FR)

(73) Assignees: Commissariat à l'Énergie Atomique et aux Énergies Alternatives, Paris (FR); Centre National de la Recherche Scientifique, Paris (FR)

( * ) Notice: Subject to any disclaimer, the term of this patent is extended or adjusted under 35 U.S.C. 154(b) by 476 days.

(21) Appl. No.: 17/965,665

(22) Filed: Oct. 13, 2022

(65) Prior Publication Data

US 2023/0180635 A1  Jun. 8, 2023

(30) Foreign Application Priority Data

Oct. 14, 2021  (FR) ...................................... 2110935

(51) Int. Cl.
*H10N 69/00* (2023.01)
*H10N 60/01* (2023.01)
*H10N 60/10* (2023.01)

(52) U.S. Cl.
CPC ............. *H10N 69/00* (2023.02); *H10N 60/01* (2023.02); *H10N 60/11* (2023.02); *H10N 60/128* (2023.02)

(58) Field of Classification Search
CPC ...... H10N 60/01; H10N 60/11; H10N 60/128; H10N 69/00; G06N 10/00; G06N 10/20; G06N 10/40; G06N 10/60; G06N 10/70; G06N 10/80

USPC .......................................................... 257/30
See application file for complete search history.

(56) References Cited

U.S. PATENT DOCUMENTS 9,842,921 B2    12/2017  Ericksson et al.
12,069,967 B2 *  8/2024  Cantaloube ............ H10N 60/12
2018/0331108 A1 11/2018  Hutin et al.

FOREIGN PATENT DOCUMENTS

WO    WO 2019/244076 A1    12/2019

OTHER PUBLICATIONS

Preliminary Search Report for French Application No. 2110935, dated May 16, 2022.
Boter et al., A sparse spin qubit array with integrated control electronics. 2019 IEEE International Electron Devices Meeting (IEDM). Dec. 7, 2019:31.4.1-31.4.4.

(Continued)

*Primary Examiner* — Monica D Harrison
(74) *Attorney, Agent, or Firm* — Wolf, Greenfield & Sacks, P.C.

(57) ABSTRACT

An elementary cell for a two-dimensional array of quantum dots, said elementary cell extending along a main plane and including: a plurality of sites occupied by quantum dots capable of confining at least one spin qubit and including at least: a first quantum dot, a second quantum dot adjacent to the first quantum dot in a first direction of the main plane, and a third quantum dot adjacent to the first quantum dot in a second direction of the main plane; and a first blocking site adjacent to the second and third quantum dots, towards which a spin qubit cannot be displaced.

15 Claims, 13 Drawing Sheets

(56) References Cited

OTHER PUBLICATIONS

Hill et al., A surface code quantum computer in silicon. Science Advances. Oct. 30, 2015;1(9):e1500707.
Li et al., A crossbar network for silicon quantum dot qubits. Science Advances. Jul. 6, 2018;4(7):eaar3960.
Tadokoro et al., Designs for a two-dimensional Si quantum dot array with spin qubit addressability. Scientific Reports. Sep. 30, 2021;11:19406.
Vandersypen et al., Interfacing spin qubits in quantum dots and donors—hot, dense, and coherent. NPJ Quantum Information. Sep. 6, 2017;3:1-10.
Veldhorst et al., Silicon CMOS architecture for a spin-based quantum computer. Nature Communications. Dec. 15, 2017;8:1-8.

* cited by examiner

ARRAY OF QUANTUM DOTS WITH SPIN QUBITS

CROSS REFERENCE TO RELATED APPLICATIONS

This application claims priority to French application number 2110935, filed Oct. 14, 2021. The content of this application is incorporated by reference in its entirety.

TECHNICAL BACKGROUND

The present disclosure generally concerns the field of quantum information or of quantum computing. It particularly concerns quantum devices with quantum bits ("qubits"), more precisely spin qubits, where the qubits are formed in quantum dots confining elementary charges.

PRIOR ART

In the field of quantum information or of quantum computing, it is advantageously desired to increase the interconnectivity between qubits, particularly for a better performance of a quantum processor, in particular for the implementation of quantum error correction codes (for example, the code called "surface code").

The quantum dots may be used as basic elements for quantum electronics. Quantum dots use semiconductor nanostructures to form potential wells and confine elementary charges (electrons or holes) in the three dimensions of space. Quantum dots aims at isolating one or a plurality of charge carriers to define one or a plurality of qubits. Qubits are defined by the spin states of the charge carriers in the quantum dots, whereby the term "spin qubit", which may be designated with the term "qubit" all along the present disclosure. According to an approach, the charge carriers are confined by field effect under control gates of the quantum dots.

When the qubits are thus formed in quantum dots confining elementary charges, the quantum dots may form an array structure, by being arranged in such a way as to favor the coupling between qubits and particularly enable to implement quantum error correction codes. Such an array of quantum dots may be linear (a single row, likening a single dimension), but it is advantageous to form a two-dimensional array, so that a cubit has at least four closest neighbors, with which it is likely to be coupled, instead or two in a linear array.

Neighboring quantum dots are interconnected to one another by tunnel barriers, and each quantum dot has its own chemical potential. The interconnectivity between two neighboring qubits may be obtained by controlling the tunnel barrier separating the two corresponding quantum dots, or even by acting on the chemical potential of one or of the two quantum dots.

A problem which is posed with such an array of quantum dots concerns the addressing of the qubits, which should be performed in an array structure to form the interconnectivities between qubits. Indeed, each of the quantum dots has to be coupled to an electric connection forming an electrical access to said quantum dot from the outside of the array, particularly to control the tunnel barriers between two quantum dots, and possibly the chemical potentials of quantum dots. The control of the interconnectivity between qubits is generally performed via control gates coupled to the quantum dots, an electric control potential being applicable to a control gate to control a qubit (individual qubit addressing) or a plurality of qubits (parallel qubit addressing).

In the case of an individual addressing, a control gate should be able to individually control a qubit. The forming of the electric connections to each of the quantum dots is complex and generally requires a plurality of electric interconnection levels, the distance between the qubits being generally too small for all the electric connections coupled to the qubits to be able to be taken out in a same interconnection level. For arrays of significant size, the number of electric interconnection levels becomes much too large for this to be possible. As a variant, the qubits may be spaced apart, typically by a distance in the order of 10 µm, to be able to integrate logic components ensuring the individual addressing of the qubits, but this requires developing transfer modules to ensure the interconnectivity between qubits despite the distance which separates them. In all cases, the addressing of the qubits may be difficult to manage due to the large number of electric connections.

The parallel addressing comprises using a same gate to control a plurality of tunnel barriers, and possibly a plurality of chemical potentials, of quantum dots, and thus to control a plurality of qubits. In practice, the parallel addressing is generally obtained by forming a plurality of gate levels on top of or inside of the array of quantum dots, typically a level of gates in rows and a level of gates in columns. A row gate is adapted to control all the qubits in the row or on either side of the row and a column gate is adapted to control all the qubits in the column or on either side of the column. Thus, generally, two levels are necessary.

This parallel addressing architecture enables to limit the number of electric connections, and thus to simplify the network of electric interconnects. However, it makes the interconnectivity between arbitrarily-selected qubits difficult. Indeed, the electric potential applied by a gate impacts the entire row of qubits or the entire column of qubits, which does not enable to select any pair of qubits or group of qubits to couple them together.

Further, the qubits are submitted to a variability issue, that is, the variability of the electric potential that should be applied to lower the tunnel barrier, in particular so that a qubit can be displaced from one quantum dot to another. This electric potential may indeed vary according to the qubits. In other words, a same electric potential applied by a gate on a same row or a same column may not have the same effect on the different qubits in the row or in the column. The described parallel addressing architecture generally does not enable to manage this variability problem, since it does not enable to differentiate the electric potentials between the qubits of a same row or of a same column.

To overcome the addressing and variability issues, another array architecture may comprise a third control gate level, in diagonal. An object is to be able to manage adjacent quantum dots differently on a same row or a same column, and particularly to compensate for the variability of the qubits, this, while keeping the possibility of applying a different electric potential via the control gates in diagonal. However, a third control gate level complicates the forming of an array of quantum dots and of its electric connections. Further, this solution finally does not enable to sufficiently locally compensate for the variability and to perform a satisfactory addressing, particular to arbitrarily select qubits. Indeed, an operation on a selection of qubits may disturb the qubits which are located around (phenomenon called "crosstalk"), and the application of an electric potential by gates in diagonal may enhance this phenomenon, which, to be compensated for, requires additional operations.

SUMMARY OF THE INVENTION

There exists a need for a quantum device in the form of an array of quantum dots confining elementary charges, which is capable of ensuring the interconnectivity between qubits arbitrarily selected in the array and this, without it being necessary to provide an individual addressing, further enabling to compensate for the variability of the qubits and to limit the above-mentioned crosstalk phenomenon.

In particular, it would for example be desirable not to complicate the forming of such an array of quantum dots and particularly to limit electric connections in said array.

An embodiment overcomes all or part of the disadvantages of known arrays of quantum dots.

An embodiment provides an elementary cell for a two-dimensional array of quantum dots, said elementary cell extending along a main plane and comprising:
    a plurality of sites occupied by quantum dots adapted to confining at least one spin qubit and comprising at least: a first quantum dot, a second quantum dot adjacent to the first quantum dot in a first direction of the main plane, and a third quantum dot adjacent to the first quantum dot in a second direction of the main plane; and
    a first blocking site adjacent to the second and third quantum dots, towards which a spin qubit cannot be displaced.

According to an embodiment, the first to third quantum dots and the first blocking site are arranged in such a way that:
    for a same signal for controlling a qubit displacement in the first direction, the displacement of a spin qubit from the first quantum dot to the second quantum dot in the first direction is allowed, while the displacement of a spin qubit from the third quantum dot in the first direction is blocked by the first blocking site; and/or
    for a same signal for controlling a qubit displacement in the second direction, the displacement of a spin qubit from the first quantum dot to the third quantum dot in the second direction is allowed while the displacement of a spin qubit from the second quantum dot in the second direction is blocked by the first blocking site.

According to an embodiment, the elementary cell comprises:
    a first control gate extending in the second direction and on a first level, said first control gate being capable of sending a signal for controlling a qubit displacement in the first direction by acting on the tunnel barrier separating the first and second quantum dots;
    a second control gate extending in the first direction and on a second level stacked to the first level, said second control gate being capable of sending a signal for controlling a qubit displacement in the second direction by acting on the tunnel barrier separating the first and third quantum dots.

According to an embodiment, the elementary cell further comprises:
    a fourth quantum dot adjacent to the first quantum dot in the first direction opposite to the second quantum dot;
    a second blocking site adjacent to the third and fourth quantum dots.

According to an embodiment, the quantum dots and the blocking sites are arranged in such a way that:
    for a same signal for controlling a qubit displacement in the first direction, the displacement of a spin qubit from the first quantum dot to the fourth quantum dot in the first direction is allowed while the displacement of a spin qubit from the third quantum dot in the first direction is blocked by the first and second blocking sites; and/or
    for a same signal for controlling a qubit displacement in the second direction, the displacement of a spin qubit from the first quantum dot to the third quantum dot in the second direction is allowed while the displacement of a spin qubit from the fourth quantum dot in the second direction is blocked by the second blocking site.

According to an embodiment, the elementary cell further comprises:
    a third control gate extending on a first level parallel to the first control gate, said third control gate being capable of sending a signal for controlling a qubit displacement in the first direction by acting on the tunnel barrier separating the first and fourth quantum dots.

According to an embodiment, the elementary cell further comprises:
    a fifth quantum dot adjacent to the first quantum dot in the second direction opposite to the third quantum dot;
    a third blocking site adjacent to the second and fifth quantum dots and a fourth blocking site adjacent to the fourth and fifth quantum dots.

According to an embodiment, the quantum dots and the blocking sites are arranged such a way that:
    for a same signal for controlling a qubit displacement in the first direction, the displacement of a spin qubit from the first quantum dot to the fourth quantum dot in the first direction is allowed while the displacement of a spin qubit from the fifth quantum dot in the first direction is blocked by the third and fourth blocking sites; and/or
    for a same signal for controlling a qubit displacement in the second direction, the displacement of a qubit from the first quantum dot to the fifth quantum dot in the second direction is allowed while the displacement of a spin qubit from the fourth quantum dot in the second direction is blocked by the second and fourth blocking sites.

According to an embodiment, the elementary cell further comprises:
    a fourth control gate extending on the second level parallel to the second control gate, said fourth control gate being capable of sending a signal for controlling a qubit displacement in the second direction by acting on the tunnel barrier separating the first and fifth quantum dots.

An embodiment provides an array of quantum dots comprising at least two elementary cells according to an embodiment, the at least two elementary cells being arranged next to one another in the first direction and/or the second direction, the array thus comprising a plurality of first, second, third quantum dots and of first blocking sites.

According to a specific embodiment, the at least two elementary cells are directly arranged next to one another in the first direction and/or the second direction. By "directly", it should be understood with no intermediate quantum dot.

According to an embodiment, the array comprises at least as many blocking sites as elementary cells.

According to an embodiment, the elementary cells adjacent in the second direction share the same first control gate and the elementary cells adjacent in the first direction share the same second control gate.

According to an embodiment, the array comprises:
- between two elementary cells adjacent in the first direction, a fifth control gate extending on the first level parallel to the first control gate; and/or
- between two elementary cells adjacent in the second direction, a sixth control gate extending on the second level parallel to the second control gate.

According to an embodiment, the array comprises a plurality of elementary cells according to an embodiment where each elementary cell comprises first, second, third, fourth, and fifth quantum dots and first, second, third, and fourth blocking sites, the cells being assembled next to one another in the first direction and/or the second direction, the array thus comprising a plurality of first, second, third, fourth, and fifth quantum dots and of first, second, third, and fourth blocking sites.

According to an embodiment, the elementary cells adjacent in the second direction share the same first and third control gates and the elementary cells adjacent in the first direction share the same second and fourth control gates.

According to an embodiment, the second direction is perpendicular to the first direction.

An embodiment provides a quantum device in the form of a two-dimensional array of quantum dots, the array comprising at least two elementary cells extending along a main plane and arranged next to one another in a first direction of the main plane and/or a second direction of the main plane, each elementary cell comprising:
- a plurality of sites occupied by quantum dots capable of confining at least one spin qubit and comprising at least: a first quantum dot, a second quantum dot adjacent to the first quantum dot in the first direction of the main plane, and a third quantum dot adjacent to the first quantum dot in the second direction of the main plane; and
- at least one blocking site not capable of confining any spin qubit, including a first blocking site adjacent to the second and third quantum dots;

the array thus comprising a plurality of first, second, and third quantum dots and of blocking sites arranged so that all or part of the second quantum dots are arranged between at least two blocking sites in the second direction, and all or part of the third quantum dots are arranged between at least two blocking sites in the first direction.

Preferably, the elementary cells are all identical, so that the array corresponds to an arrangement of a plurality of identical elementary cells in a first direction and/or a second direction.

The positioning of the second quantum dots between at least two blocking sites in the second direction enables to allow the displacement of a spin qubit from and to said second quantum dot only in the first direction. The positioning of the third quantum dots between at least two blocking sites in the first direction enables to allow the displacement of the spin qubits from and to this third quantum dot only in the second direction.

According to an embodiment, for each elementary cell:
- the quantum dots further comprise a fourth quantum dot adjacent to the first quantum dot in the first direction opposite to the second quantum dot;
- the at least one blocking site further comprises a second blocking site adjacent to the third and fourth quantum dots;
- the array thus also comprising a plurality of fourth quantum dots, the quantum dots and the blocking sites being arranged so that all or part of the fourth quantum dots are arranged between at least two blocking sites in the second direction.

The positioning of the fourth quantum dots between at least two blocking sites in the second direction enables to allow the displacement of a spin qubit from and to said fourth quantum dot only in the first direction.

According to an embodiment, for each elementary cell:
- the quantum dots further comprise a fifth quantum dot adjacent to the first quantum dot in the second direction opposite to the third quantum dot;
- the at least one blocking site further comprises a third blocking site adjacent to the second and fifth quantum dots and a fourth blocking site adjacent to the fourth and fifth quantum dots;
- the array thus also comprising a plurality of fifth quantum dots, the quantum dots and the blocking sites being arranged so that all or part of the second quantum dots are arranged between at least four blocking sites in the second direction, all or part of the third quantum dots are arranged between at least four blocking sites in the first direction, all or part of the fourth quantum dots are arranged between at least four blocking sites in the second direction, and all or part of the fifth quantum dots are arranged between at least four blocking sites in the first direction.

The positioning of the fifth quantum dots between at least four blocking sites in the first direction enables to allow the displacement of a spin qubit from and to said fifth quantum dot only in the second direction.

Preferably, the array comprises at least three elementary cells, and the elementary cells are arranged next to one another in the first direction and in the second direction.

According to an embodiment, each quantum dot is a semiconductor nanostructure and each blocking site is a nanostructure at least partially semiconductor-free, for example, comprising a dielectric material.

According to a specific embodiment, each blocking site is a nanostructure mainly semiconductor-free, for example comprising a dielectric material.

According to an embodiment, the edges of each quantum dot are coupled to a control gate.

According to an embodiment, the tunnel barriers between two quantum dots are all coupled to a control gate.

Preferably, the tunnel barriers of a same row (in the first direction) are controlled by a same control gate, and the tunnel barriers of a same column (in the second direction) are controlled by a same control gate. Thus, the tunnel barriers between two quantum dots are not individually controlled, but they are controlled in row(s) and in column(s).

According to an embodiment, the edges of some among the blocking sites, for example, blocking sites on the edges of the array, are not all coupled to a control gate.

An embodiment provides a method of qubit displacement in an array of quantum dots, for example, of a quantum device according to an embodiment, the displacement method comprising:
- a step of application of a signal of qubit displacement in the first direction, said signal being applied to an alignment, in the second direction, of quantum dots comprising at least first and third quantum dots, the displacement signal allowing the displacement of a qubit in the first direction from the first quantum dot to a second quantum dot adjacent to the first quantum dot, while the displacement of a qubit from the third quantum dot in the first direction is blocked by a blocking site.

According to an embodiment, the method further comprises, prior to the step of application of the displacement signal, a step of displacement in the second direction of at least one qubit from a first quantum dot to a third quantum dot adjacent to said first quantum dot to have the displacement in the first direction of said qubit blocked by the blocking site.

An embodiment provides a method of manufacturing an array of quantum dots, for example, of a quantum device according to an embodiment, said manufacturing method comprising the following steps:
- a step of provision of a substrate having at least one upper layer made of semiconductor material;
- a step of forming of blocking sites and of quantum dots, said forming step comprising the removal of the semiconductor material from first areas of the upper semiconductor layer to form a plurality of blocking sites, second areas of the upper semiconductor layer where the semiconductor material is not removed forming a plurality of first, second, and third quantum dots; said forming step being carried out in such a way that each second quantum dot is adjacent to a first quantum dot in a first direction of the main plane, that each third quantum dot is adjacent to a first quantum dot in a second direction of the main plane, and that each blocking site is adjacent to a second quantum dot and a third quantum dot.

According to an embodiment, the substrate further comprises a lower layer made of a dielectric material arranged under the upper layer.

According to a specific embodiment, the removal of the semiconductor material from the first areas of the upper semiconductor layer is adapted to exposing the dielectric material of the lower layer.

According to an embodiment, the removal of the semiconductor material comprises:
- a photolithography step capable of forming on the upper semiconductor layer a resist pattern and holes within the pattern; and
- a step of etching of the upper semiconductor layer in the holes so as to form the blocking sites.

According to a specific embodiment, the step of etching of the upper semiconductor layer in the holes is carried out down to the lower dielectric layer.

According to an embodiment, the method further comprises:
- a step of forming of a first level of control gates extending parallel to one another in the second direction; and
- a step of forming of a second level of control gates extending parallel to one another in the first direction.

According to a specific embodiment, each step of forming of the first and of the second control gate level comprises a step of deposition of a layer made of a conductive material, followed by a photolithography step and then by an etch step.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the structure of a quantum dot capable of confining a spin qubit has not been detailed. Such a quantum dot may be formed by using the technology of field-effect transistors (FET), and particularly with a technology derived from that of CMOS devices, or by other technologies.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred unless otherwise specified to the orientation of the drawings or to an array of quantum dots in a normal position of use.

Unless specified otherwise, the expressions "around", "approximately", "substantially" and "in the order of" signify within 10%, and preferably within 5%.

Figure 1:
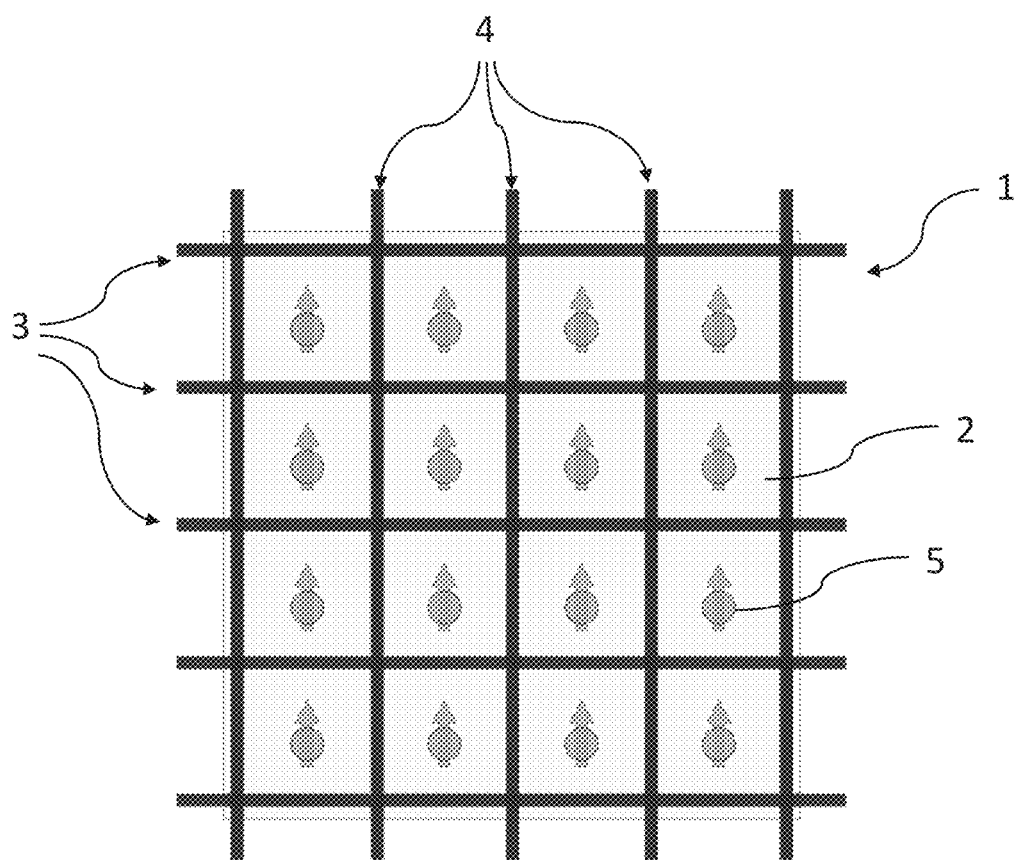
FIG. 1 shows an array of quantum dots.

FIG. 1 shows a two-dimensional array 1 of quantum dots 2. Each quantum dot 2 contains a qubit 5. The formed array thus is a dense qubit array. The coupling between a central qubit is possible with at least its four closest neighboring qubits, particularly by acting on the tunnel barrier between the corresponding quantum dots. More precisely, a level of gates in rows 3 and a level of gates in columns 4 enable to apply an electric control potential with a plurality of quantum dots to be able to perform a parallel addressing of qubits. A row gate 3 is adapted to controlling all the qubits located on either side of the row and a column gate 4 is adapted to control the qubits located on either side of the column. Thus, while the operation over a full row or over a full column can be envisaged, a local operation on a single qubit or two given qubits becomes complex, or even impossible. Further, such a dense array structure does not enable to locally compensate for the variability of the qubits.

The inventors provide improved arrays of quantum dots, according to embodiments, enabling to overcome all or part of the previously-mentioned disadvantages.

Figure 2A:
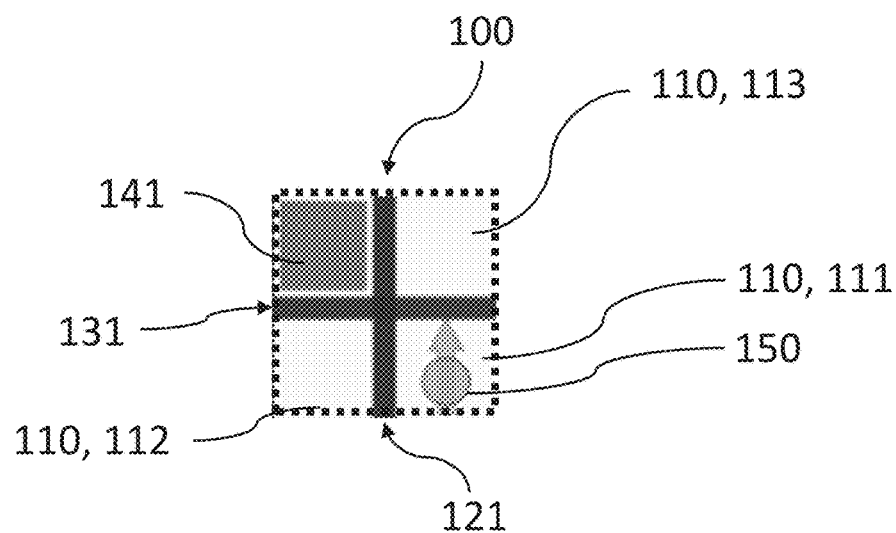
FIG. 2A shows a top view of an elementary cell of an array of quantum dots according to an embodiment.
Figure 2B:
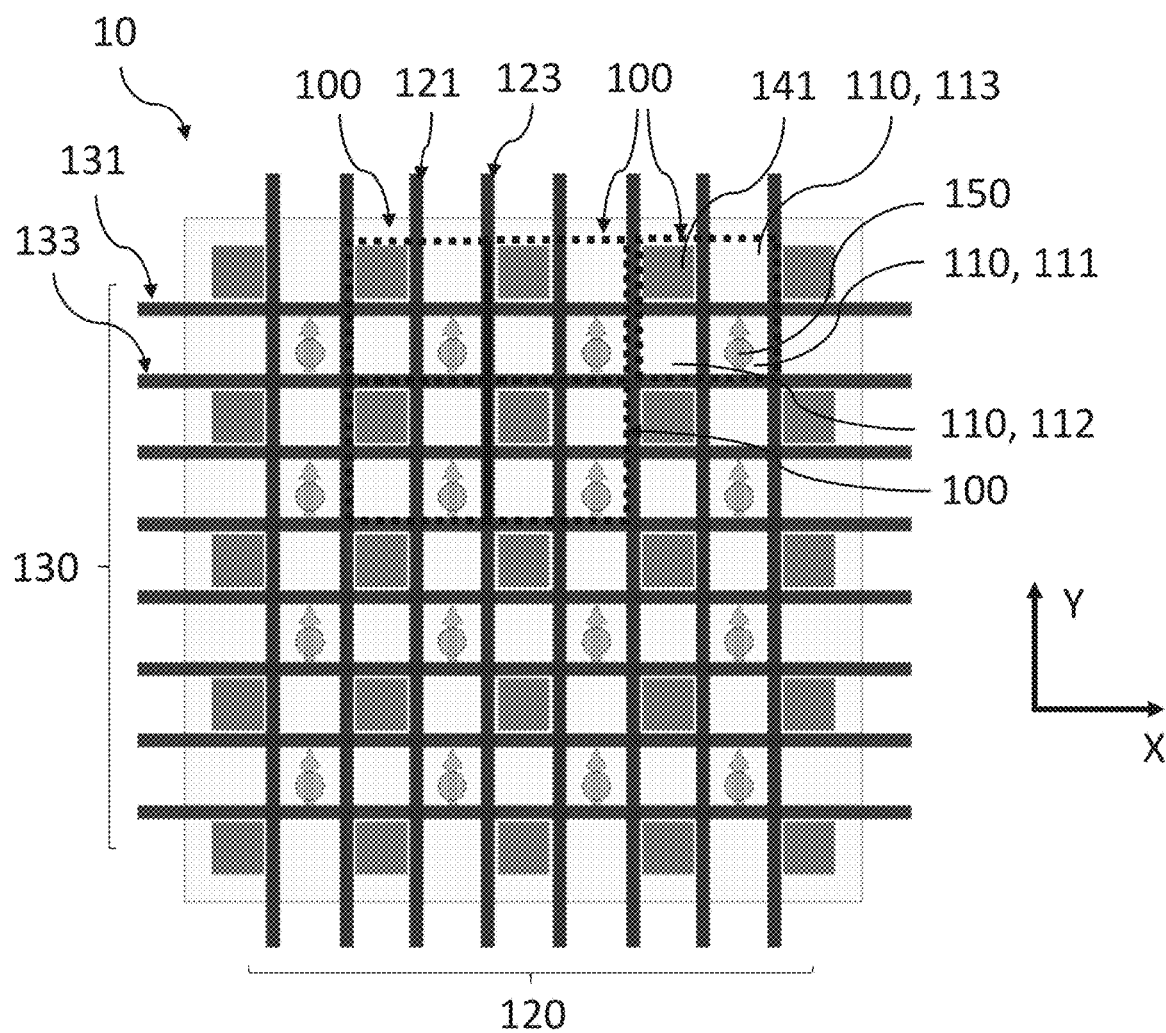
FIG. 2B shows a top view of an array of quantum dots comprising a plurality of elementary cells of FIG. 2A.

FIGS. 2A and 2B respectively show an elementary cell 100 according to an embodiment and a two-dimensional array 10 comprising a plurality of elementary cells 100.

Elementary cell 100 has in top view (main plane XY) a substantially square shape comprising four sites. Three of the sites are occupied by quantum dots 110 and a fourth site a first blocking site 141 of the qubits.

A blocking site is defined as being a site configured to block/forbid the displacement of any spin qubit towards and inside of said site. In other words, a blocking site is a site that cannot confine a spin qubit. A blocking site may for example be formed by etching at the bottom of areas defined in the array the semiconductor layer having the quantum dots formed therein.

Each quantum dot 110 is capable of confining at least one spin qubit 150, two adjacent quantum dots being separated by a tunnel barrier so that a spin qubit 150 can be confined in one of the two quantum dots and/or displace between the two quantum dots by tunnel effect.

The quantum dots comprise:
a first quantum dot 111;
a second quantum dot 112 adjacent to the first quantum dot in a first direction X of main plane XY; and
a third quantum dot 113 adjacent to the first quantum dot in a direction Y of main plane XY.

The shown elementary cell 100 further comprises:
a first control gate 121 extending in the second direction Y (in a column) and on a first level 120, said first control gate being capable of sending a signal for controlling a qubit displacement in the first direction X by acting on the tunnel barrier separating the first and second quantum dots 111, 112; and
a second control gate 131 extending in the first direction X (in a row) and on a second level 130 stacked to the first level 120, said second control gate being capable of sending a signal for controlling a qubit displacement in the second direction Y by acting on the tunnel barrier separating the first and third quantum dots 111, 113.

Quantum dots 111, 112, 113 and first blocking site 141 are arranged in such a way that:
when first gate 121 outputs a signal for controlling a qubit displacement in first direction X, a qubit 150 confined in first quantum dot 111 can be displaced towards the second quantum dot 112, while a qubit confined in third quantum dot 113 cannot displace in first direction X since the first blocking site 141 blocks the displacement of qubits in this direction; and
when second gate 131 outputs a signal for controlling a qubit displacement in second direction Y, a qubit 150 confined in first quantum dot 111 can be displaced towards third quantum dot 113, while a qubit confined in second quantum dot 112 cannot displace in second direction Y since first blocking site 141 blocks the displacement of qubits in this direction.

First blocking site 141 is shown diagonally to first quantum dot 111, second quantum dot 112 is arranged under first blocking site 141 in second direction Y, and third quantum dot 113 is arranged on the right-hand side of first blocking site 141 in first direction X, but other configurations are possible. For example, second quantum dot 112 may be arranged above first blocking site 141 and/or third quantum dot 113 may be arranged on the left-hand side of first blocking site 141.

FIG. 2B shows an array 10 of quantum dots 110, the array being formed by a plurality of same elementary cells 100 adjacent to one another in first direction X and in second direction Y.

In the array 10 thus formed, the second and third quantum dots 112, 113 of the plurality of elementary cells 100 are placed between two first blocking sites 141 in one or the other of two directions X, Y (except for certain second and third quantum dots located in the edges of the array).

The second and third quantum dots may be designated as being storage dots. A qubit placed (stored) in a storage dot becomes insensitive to all or to part of the signals of a same control row or column (sent via the corresponding control gate).

To make a (a plurality of) qubit(s) insensitive to all or part of the signals of a same control row (respectively of a same control column), the invention enables to displace this (these) qubit(s) into a (a plurality of) storage dot(s) cleverly selected to allow the deselection of this (these) qubit(s) prior to an operation on a row (respectively on a column) of the array. In other words, to address a portion only of the qubits of a row (respectively of a column), certain qubits of said row are previously deselected by being displaced to a neighboring column (respectively to a neighboring row) in a storage quantum dot where their displacement is no longer allowed in the direction of the row (respectively of the column).

The elementary cells adjacent in the second direction Y share the same first control gate 121 and the elementary cells adjacent in the first direction X share the same second control gate 131.

Further, array 10 comprises, between two cells adjacent in the first direction X, a complementary control gate 123 (also called fifth control gate) parallel to first control gate 121 and, between two cells adjacent in the second direction Y, a complementary control gate 133 (also designated as sixth control gate) parallel to second control gate 131.

The shown array 10 thus comprises:
a first level 120 of control gates 121, 123 extending parallel to one another in the second direction Y, thus forming gate columns; each column gate is capable of controlling the displacement of spin qubit 150 between two adjacent quantum dots arranged on either side of said gate; and
a second level 130 of control gates 131, 133 extending parallel to one another in the first direction X thus forming gate rows; second level 130 is stacked to first level 120; each row gate is capable of controlling the displacement of spin qubits 150 between two adjacent quantum dots arranged on either side of said gate.

Thus, array 10 is obtained by the arrangement of a plurality of elementary cells 100 next to one another in both directions X and Y, and the quantum dots adjacent in each of the two directions are arranged on either side of a same control gate to be able to control the tunnel barriers between said quantum dots and, thereby, the displacements of qubits between said quantum dots. In other words, the tunnel barriers of a same row are controlled by a same control gate, and the tunnel barriers of a same column are controlled by a same control gate.

Further, the clever positioning of blocking sites in front of the quantum dots, and particularly of the storage quantum dots, enables, after a row or column displacement command, to authorize or block the displacement of a (or a plurality of)

qubit(s) in one or the other of the two directions, according to the positioning of the qubit(s) before the command.

As will be explained in relation with FIGS. 4A to 4H, this enables to perform operations on certain qubits arbitrarily selected in the array, and this, despite having chosen the row and column parallel addressing. Further, the embodiment of FIG. 2B enables to limit the number of displacements to be performed on the qubits. Further, this enables to perform such operations without however complicating the qubit interconnection network, since it is in particular not necessary to add a level of control gates.

Figure 3A:
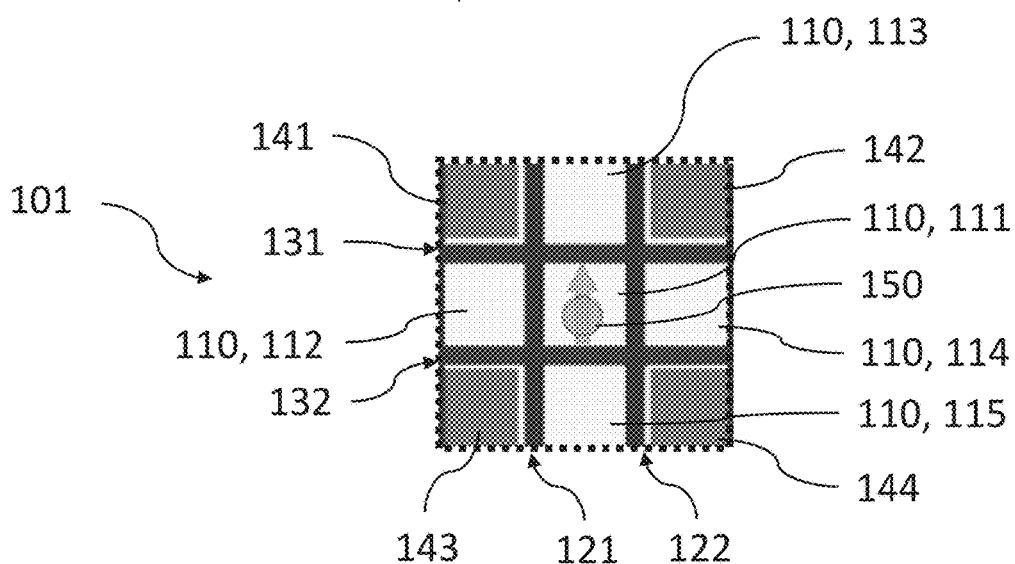
FIG. 3A shows a top view of an elementary cell of an array of quantum dots according to another embodiment.
Figure 3B:
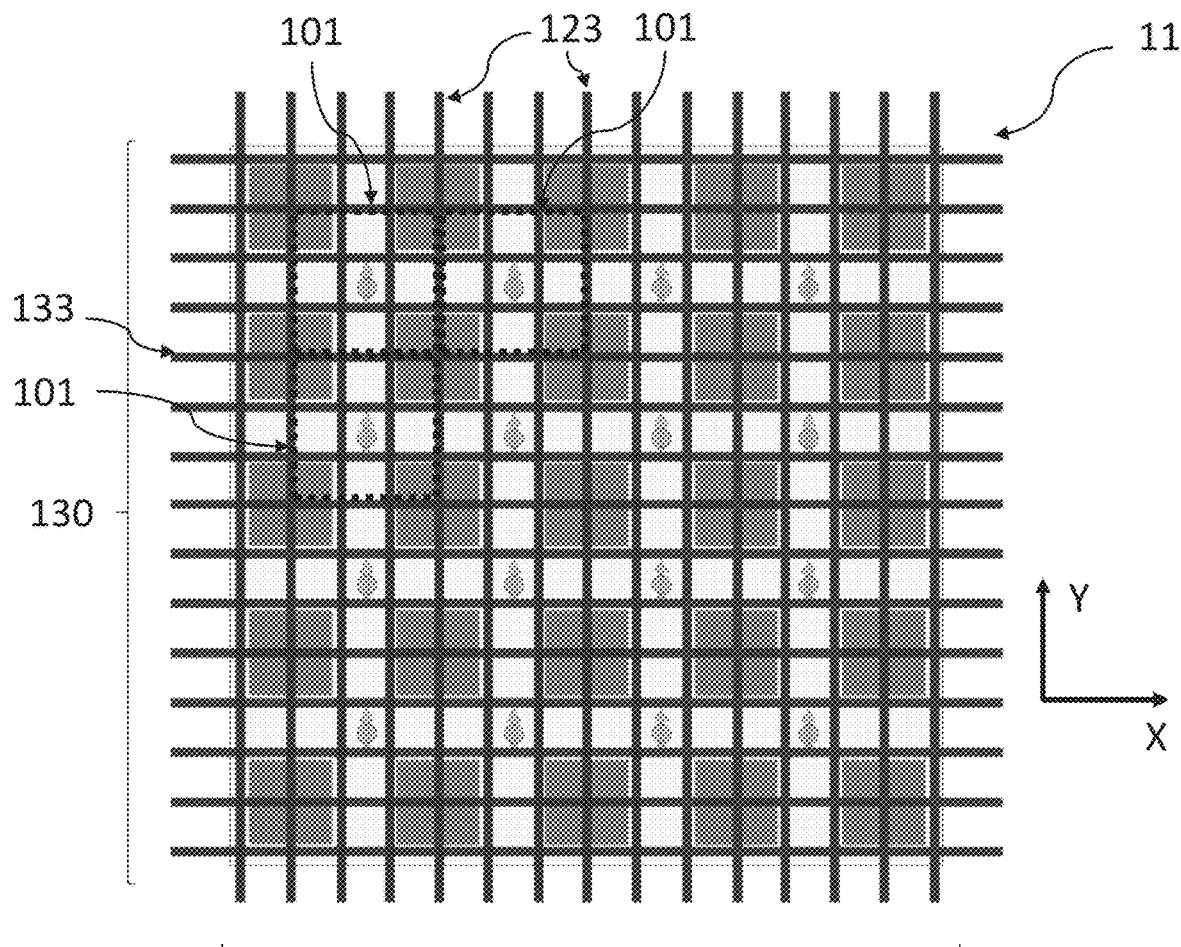
FIG. 3B shows a top view of an array of quantum dots comprising a plurality of elementary cells of FIG. 3A.

FIGS. 3A and 3B respectively show an elementary cell 101 according to another embodiment and a two-dimensional array 11 comprising a plurality of elementary cells 101.

Like for the elementary cell 100 of FIG. 2A, the elementary cell 101 of FIG. 3A has in top view (main plane XY) a substantially square shape, but it differs therefrom in that it comprises nine sites, five of these sites being occupied by quantum dots 110 and four of these sites being qubit blocking sites. The first, second, third quantum dots 111, 112, 113, and the first blocking site 141 of the elementary cell 101 of FIG. 3A are arranged in the same way as for the elementary cell 100 of FIG. 2A.

In addition to the quantum dots of the elementary cell 100 of FIG. 2A, the elementary cell 101 of FIG. 3A comprises:
  a fourth quantum dot 114 adjacent to the first quantum dot in the first direction X and opposite to second quantum dot 112; and
  a fifth quantum dot 115 adjacent to the first quantum dot in second direction Y and opposite to third quantum dot 113.

In addition to the first blocking site 141 of the elementary cell 100 of FIG. 2A, the elementary cell 101 of FIG. 3A comprises:
  a second blocking site 142;
  a third blocking site 143; and
  a fourth blocking site 144.

The quantum dots and the blocking sites are arranged so that the second to fifth quantum dots are between two blocking sites. More precisely, in the shown example:
  second quantum dot 112 is between the first and third blocking sites 141, 143;
  third quantum dot 113 is between the second and fourth blocking sites 141, 142;
  the fourth quantum dot 114 is between the second and fourth blocking sites 142, 144; and
  the fifth quantum dot 115 is between the third and fourth blocking sites 143, 144.

The blocking sites are shown diagonally to first quantum dot 111.

In addition to the first and second control gates of the elementary cell 100 of FIG. 2A, the elementary cell 101 of FIG. 3A comprises:
  a third control gate 122 parallel to first control gate 121 (in a column) on first e 120, said third control gate being capable of sending a signal for controlling a qubit displacement in first direction X by acting on the tunnel barrier separating the first and fourth quantum dots 111, 114; and
  a fourth control gate 132 parallel to second control gate 131 (in a row) on second level 130, said fourth control gate being capable of sending a signal for controlling a qubit displacement in second direction Y by acting on the tunnel barrier separating the first and third quantum dots 111, 115.

In addition to the arrangement already defined for the elementary cell 100 of FIG. 2A, the quantum dots and the blocking sites of the elementary cell 101 of FIG. 3A are arranged in such a way that:
  when third gate 122 outputs a control signal of qubit displacement in first direction X, a qubit confined in first quantum dot 111 may be displaced towards fourth quantum dot 114, while a qubit confined in fifth quantum dot 115 cannot displace in first direction X since the third and fourth blocking sites 143, 144 block the displacement of qubits in this direction; and
  when fourth gate 132 outputs a signal for controlling a qubit displacement in second direction Y, a qubit confined in first quantum dot 111 can be displaced towards fifth quantum dot 115, while a qubit confined in fourth quantum dot 114 cannot displace in second direction Y since the second and fourth blocking sites 142, 144 block the displacement of qubits in this direction.

FIG. 3B shows an array 11 of quantum dots 110, the array being formed by a plurality of same elementary cells 101 adjacent to one another in first direction X and in second direction Y.

The elementary cells adjacent in the second direction Y share the same first and third control gates 121, 122 and the elementary cells adjacent in the first direction X share the same second and fourth control gates 131, 132.

Further, array 11 comprises, between two cells adjacent in the first direction X, a complementary control gate 123 (also called fifth control gate) parallel to first control gate 121 and, between two cells adjacent in the second direction Y, a complementary control gate 133 (also designated as sixth control gate) parallel to second control gate 131.

The shown array 11 thus comprises:
  a first level 120 of control gates 121, 122, 123 extending parallel to one another in the second direction Y, thus forming gates in columns; each column gate is capable of controlling the displacement of spin qubits 150 between two adjacent quantum dots arranged on either side of said gate;
  a second level 130 of control gates 131, 132, 133 extending parallel to one another in the first direction X thus forming gates in rows; second level 130 is stacked to first level 120; each row gate is capable of controlling the displacement of spin qubits 150 between two adjacent quantum dots arranged on either side of said gate.

In other words, the tunnel barriers of a same row are controlled by a same control gate, and the tunnel barriers of a same column are controlled by a same control gate.

The second to fifth quantum dots of the plurality of elementary cells 101 can be designated as being storage dots. As explained for the array of FIG. 2B, a qubit placed in such a storage dot becomes insensitive to all or to part of the signals of a same control row or column (sent via the corresponding control gate). To make a (a plurality of) qubit(s) insensitive to all or part of the signals of a same row (respectively of a same control column), the invention enables to displace this (these) qubit(s) into a (a plurality of) storage dot(s) cleverly selected to allow the deselection of this (these) qubit(s) prior to an operation on a row (respectively a column) of the array. In other words, to address a portion only of the obits of a row (respectively of a column), certain qubits of said row are previously deselected by being displaced to a neighboring column (respectively to a neighboring row) in a storage quantum dot where their displacement is no longer allowed in the direction of the row (respectively of the column). This enables to perform operations over certain qubits arbitrarily selected in the array, and this, despite having chosen the row and column parallel addressing. Further, this enables to perform such operations without however complicating the qubit interconnection network, since it is in particular not necessary to add a level of control gates.

The array 11 obtained by the arrangement of a plurality of elementary cells 101 can be distinguished from the array 10 of FIG. 2B in that the storage dots are positioned between, no longer two, but four blocking sites in the first direction and in the second direction. In other words, there are two blocking sites on either side of a same storage dot. This allows a better isolation of the qubits stored in the storage dots during row or column control operations.

By allowing the deselection of certain qubit(s) before an operation, the invention also enables to compensate for the variability of the qubits.

In FIGS. 2A, 2B, 3A, and 3B, the control gates are shown as being perpendicular with respect to one another, directions X and Y being perpendicular, but other configurations are possible. As a variant, directions X and Y are not perpendicular.

Further, in embodiments, an array may comprise quantum dots adjacent also in more than two directions in the plane and/or the qubits may be displaced in more than two directions in the plane, for example in a third direction in addition to the first and second directions. The quantum dots and the blocking sites are then cleverly arranged to perform the desired operations between qubits of the array in each of the three directions of the plane. An array of quantum dots may in particular have a hexagonal mesh.

Figure 4A:
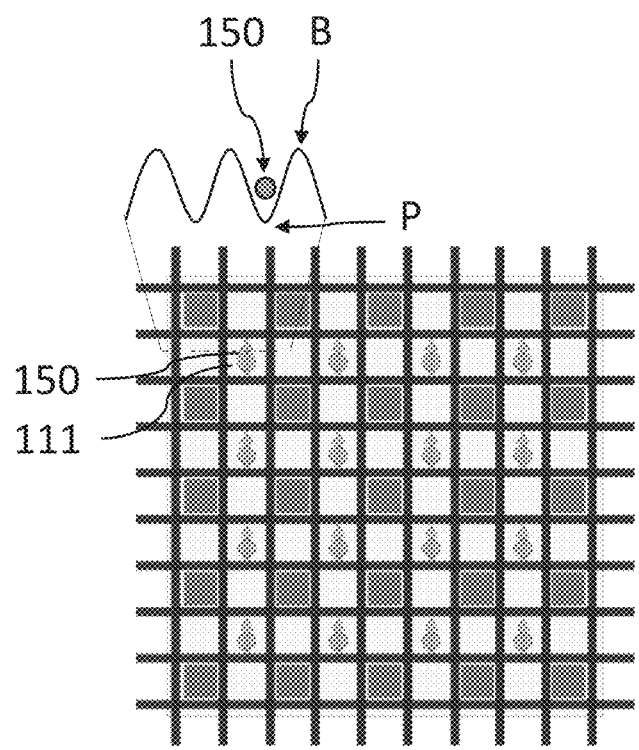
FIG. 4A, FIG. 4B, FIG. 4C, FIG. 4D, FIG. 4E, FIG. 4F, FIG. 4G, and FIG. 4H show examples of methods of qubit displacement within an array of quantum dots according to an embodiment.

FIGS. 2A, 2B, 3A, and 3B, as well as FIG. 4A described hereafter, show a state called "inactive" where the control gates have not acted on the quantum dots and thus have not displaced the qubits. In the shown inactive state, spin qubits 150 are arranged in the first quantum dots. As a variant, the spin qubits may be in one of the storage dots in the inactive state.

FIGS. 4A to 4H show examples of methods of qubit displacement within an array of quantum dots such as that shown in FIG. 2B.

As indicated hereabove, FIG. 4A shows a state called "inactive" corresponding to FIG. 2A where the control gates have not acted on the quantum dots and thus have not displaced the qubits, and where spin qubits 150 are arranged in the first quantum dots. Further, a curve schematically showing for three quantum dots the levels B of the tunnel barriers between two adjacent quantum dots and the chemical potentials P of these three quantum dots, as well as the qubit 150 confined in the first quantum dot 111, has been shown above the array.

Figure 4B:
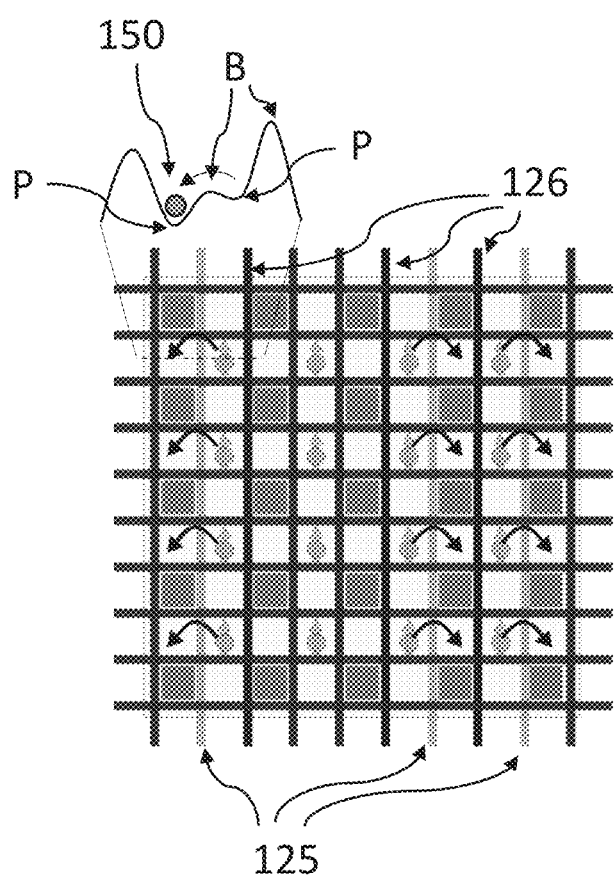

FIG. 4B shows an operation, starting from the state of FIG. 4A, where it is acted on the tunnel barriers between adjacent columns of quantum dots. More precisely, certain gates 125 in a column are activated to lower the tunnel barriers between the quantum dots located on either side of said gates. This enables to control the displacement of columns of qubits in first direction X. In parallel, other column gates 126, adjacent to gates 125, may be activated to raise the tunnel barrier and ensure that the qubits are effectively displaced only where the tunnel barriers are lowered.

It can be seen on the curve above the three quantum dots in FIG. 4B that the levels B of the tunnel barriers between the adjacent quantum dots have been modified, more precisely, that they have been lowered by gates 125 and raised by gates 126. This induces an increase in the chemical potential P of the quantum dot where the qubit was initially confined. Further, it can be seen that qubit 150 is displaced towards the adjacent quantum dot located on the other side of the lowered tunnel barrier.

Thus, this operation has enabled to displace a plurality of columns of qubits onto the other side of the lowered tunnel barriers. These displaced qubits are stored in storage quantum dots from which they can no longer displace in second direction Y. A single column of qubits has not been activated.

Figure 4C:
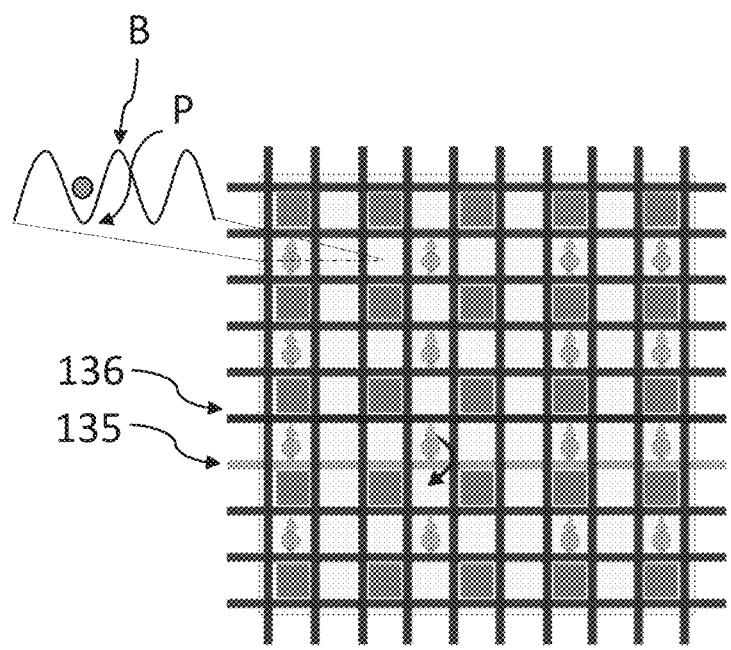

It can be seen on the curve above the array shown in FIG. 4C that the levels B of the tunnel barriers between the adjacent quantum dots and the levels P of the chemical potentials of the quantum dots are similar to those of FIG. 4A, except that qubit 150 has been displaced into a quantum dot adjacent to the first quantum dot.

FIG. 4C shows an operation consecutive to that of FIG. 4B, where a row gate 135 is actuated to act on the tunnel barriers between two adjacent rows of quantum dots located on either side of gate 135. This enables to control the displacement of a row of qubits in second direction Y. In parallel, another row gate 136, adjacent to gate 135, may be activated to raise the tunnel barrier and ascertain that the qubits are effectively displaced only where the tunnel barriers are lowered. Since the qubits stored in the storage dots are blocked by the blocking sites, this operation has enabled to only displace the non-stored qubits of the activated row, in the case in point a single qubit in the shown example.

Figure 4D:
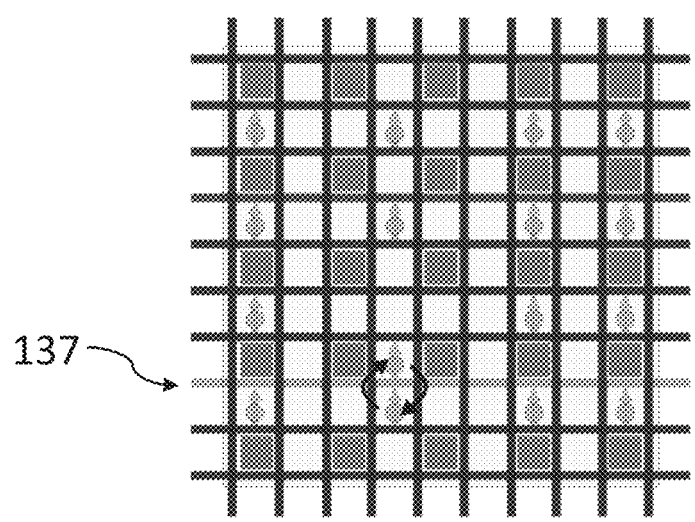

As can be seen in FIG. 4D, the coupling of a pair of qubits thus taken closer to each other and isolated from the other qubits has thus been allowed, by actuating another row gate 137, to lower the tunnel barrier between the quantum dots containing the pair of qubits thus taken closer to each other.

Figure 4E:
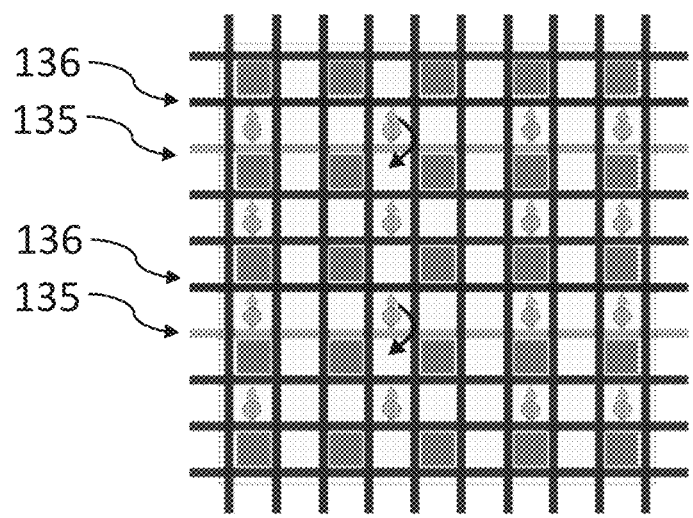

FIG. 4E shows an operation alternative to that of FIG. 4C where not a single, but a plurality of gates 135 (in the case in point two gates in the shown example), are actuated to act on the tunnel barriers between quantum dots arranged on either side of said gates. This enables to control the displacement of a row of qubits in second direction Y. In parallel, two other gates 136 in a row, adjacent to gates 135, may be activated to raise the tunnel barrier and ensure that the qubits are effectively displaced only where the tunnel barriers are lowered. Since the qubits stored in the storage dots are blocked by the blocking sites, this operation has enabled to only displace the non-stored qubits of the activated rows, in the case in point two qubits in the shown example.

Figure 4F:
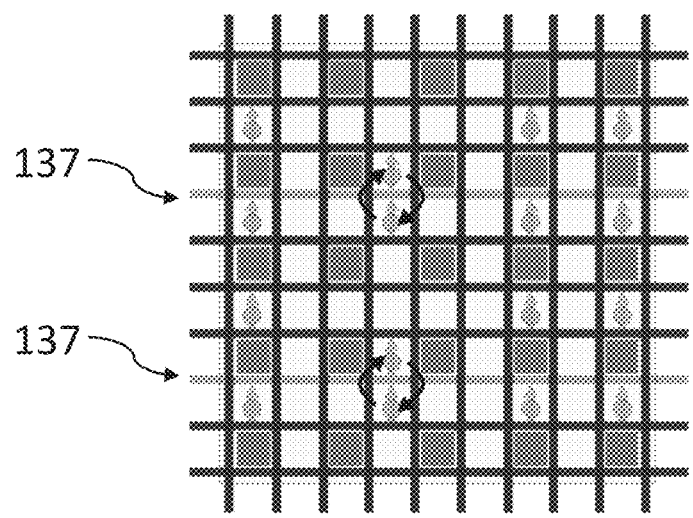

As can be seen in FIG. 4F, the coupling of two pairs of qubits thus taken closer to each other and isolated from the other qubits has thus been allowed, by actuating two other row gates 137, to lower the tunnel barrier between the quantum dots containing the two other pairs of qubits thus taken closer to each other.

Advantageously, the local variability can be compensated for by adjusting the interaction time (particularly the duration of lowering of the tunnel barrier) or the voltage value applied to a control gate in the case, as that shown in FIGS. 4D and 4F, where a single pair of spin qubits is selected per control row (or per control column in other cases).

Figure 4G:
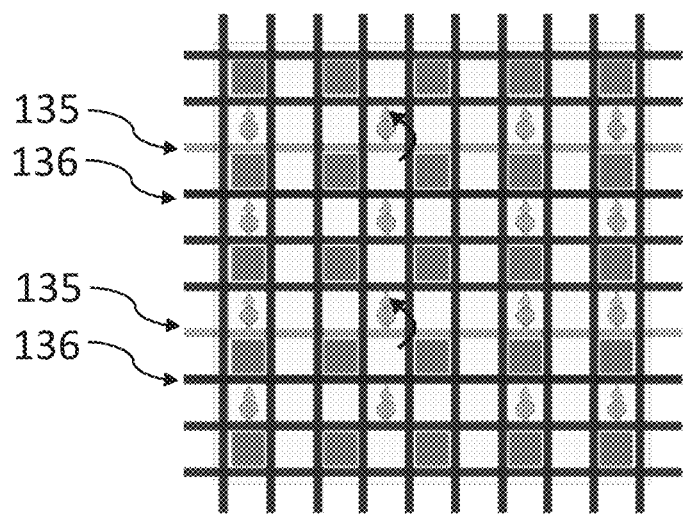
Figure 4H:
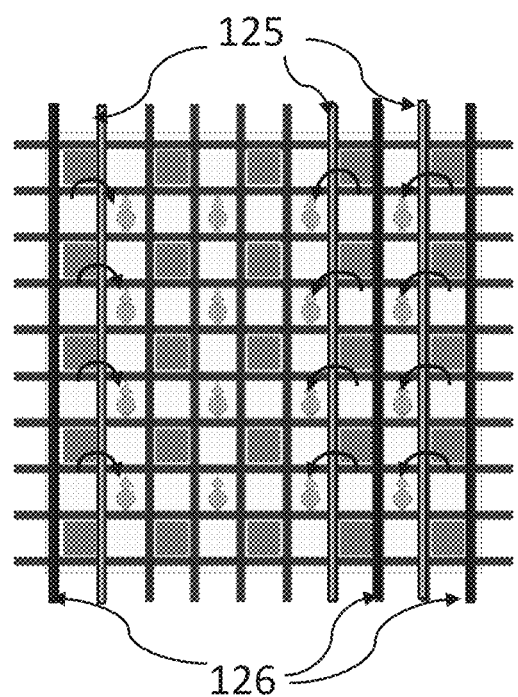

FIGS. 4G and 4H show, starting from the configuration of FIG. 4F, the inverse operations which are performed to recover the inactive state of FIG. 4A. In FIG. 4G, row gates 135 are activated to lower the tunnel barriers and row gates 136 adjacent to gates 135 may be activated to raise the tunnel barriers, so that the qubits return to their initial rows. Then, as shown in FIG. 4H, column gates 125 are activated to lower the tunnel barriers and column gates 126 adjacent to gates 125 may be activated to raise the tunnel barriers, so that the qubits return to their initial columns.

These examples of operations, which are by no means limiting, enable to show the qubit displacement principle implementing an array of quantum dots according to an embodiment, and this, to take qubits closer to one another and to perform operations between said qubits. Obviously, other operations are possible, and those skilled in the art will be capable of adapting the displacement method for the operations that they wish to perform and will also be capable of adapting the operations to any considered quantum dot array configuration.

For example, the previously-described operations may be adapted to the array 11 of FIG. 3B. For example, to take two qubits initially in the first quantum dots as shown in FIG. 3B closer to each other, at least two displacement operations are necessary, instead of one, but the stored qubits are better isolated.

Figure 5A:
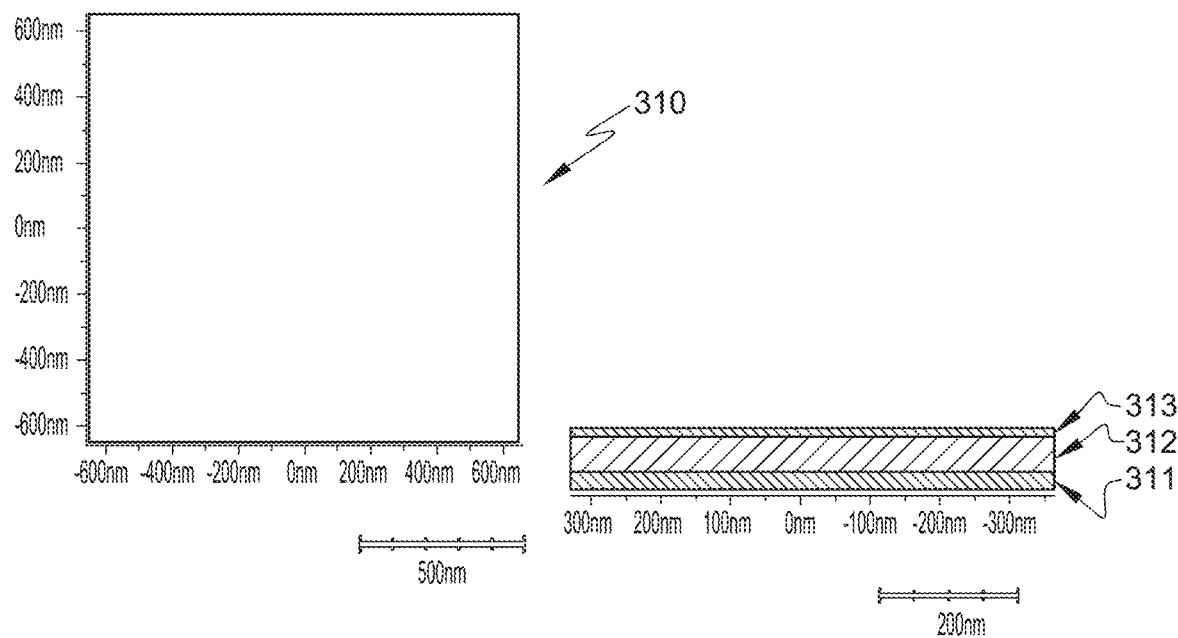
FIG. 5A, FIG. 5B, FIG. 5C, FIG. 5D, FIG. 5E, FIG. 5F, FIG. 5G, FIG. 5H, and FIG. 5I show an example of a method of manufacturing an array of quantum dots according to an embodiment.
Figure 5B:
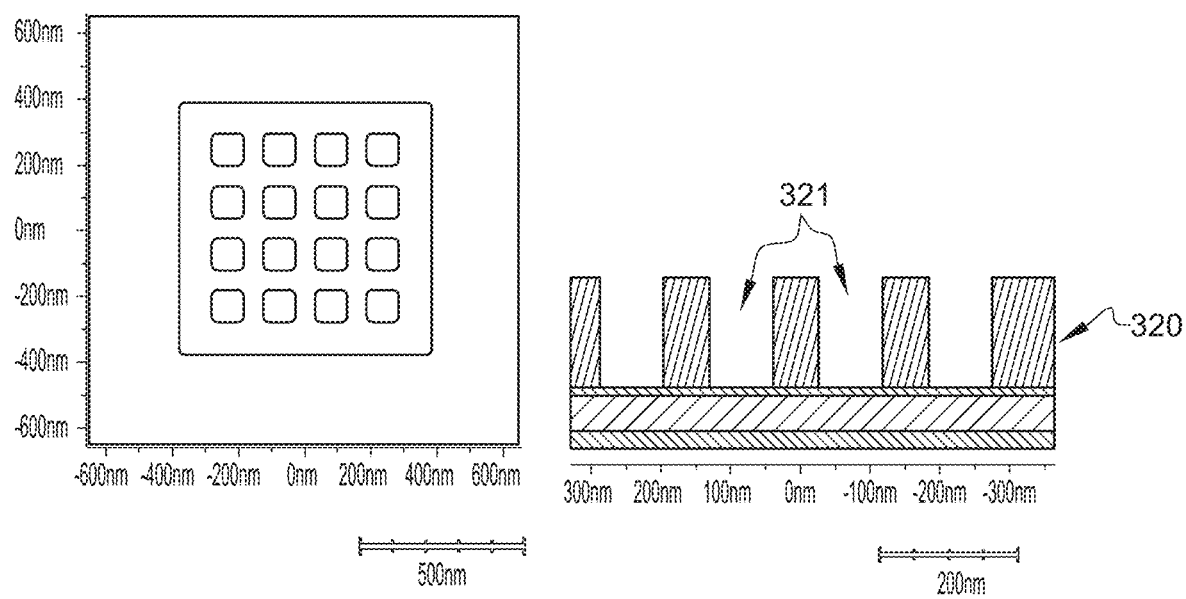
Figure 5C:
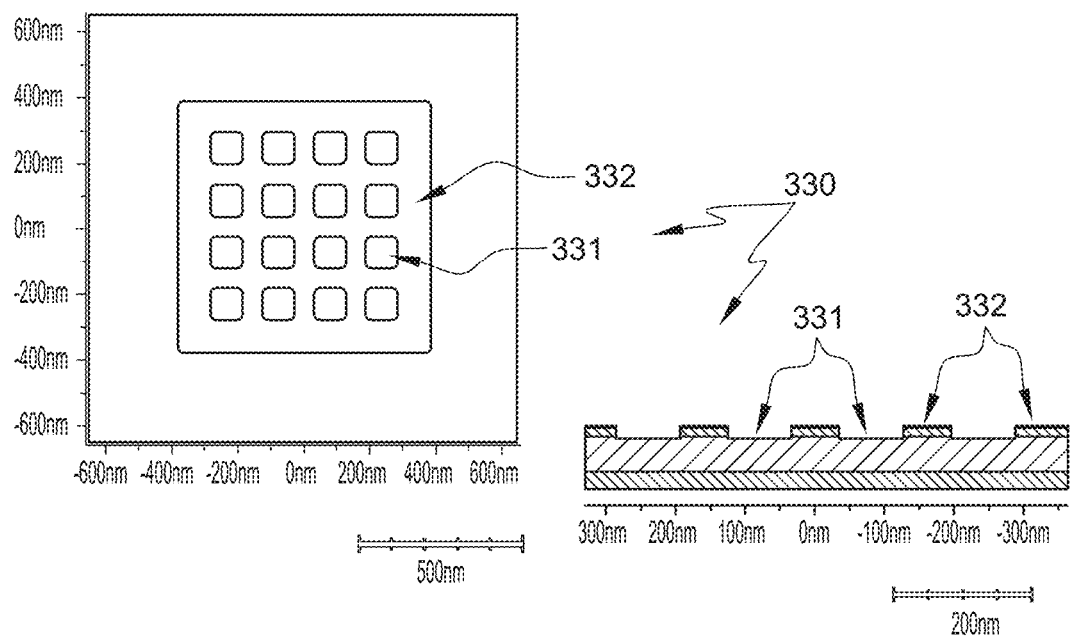
Figure 5D:
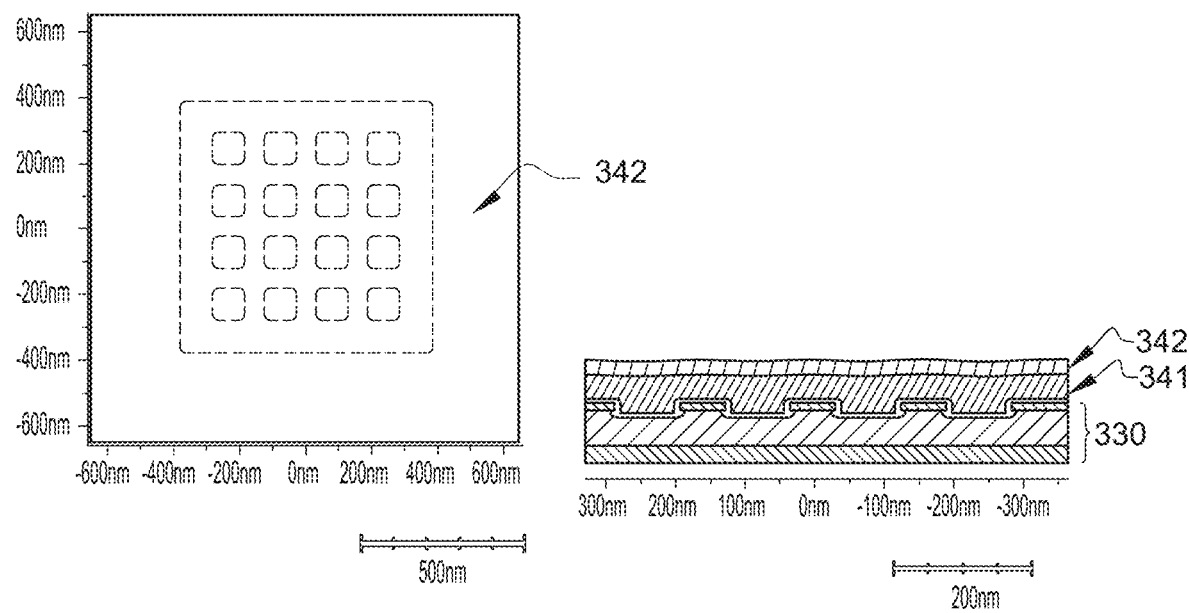
Figure 5E:
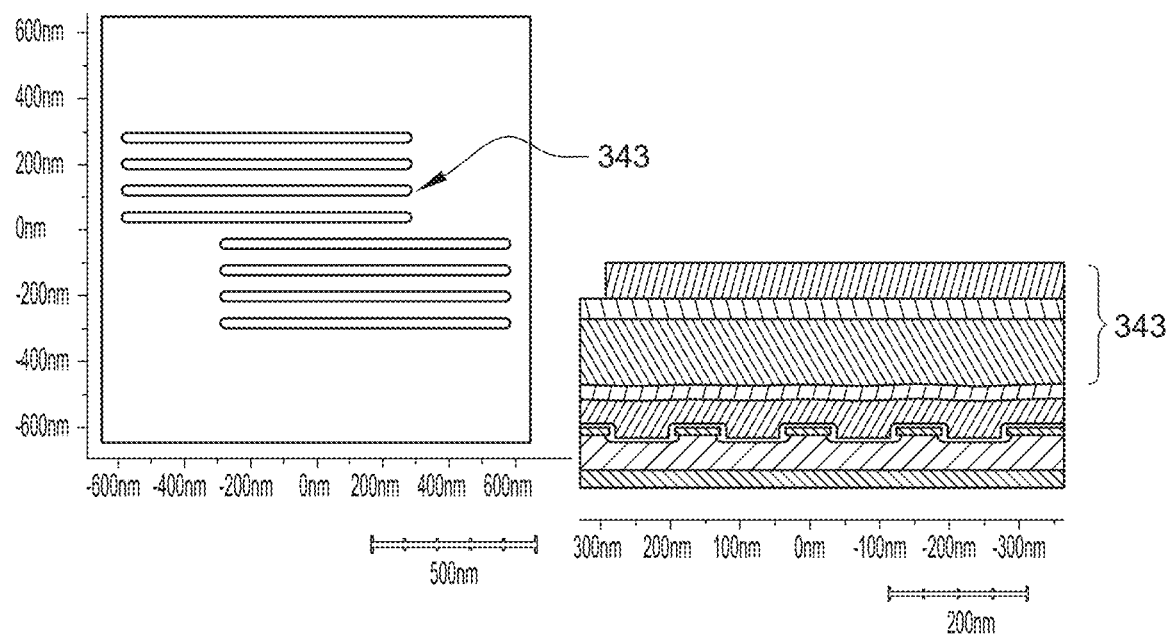
Figure 5F:
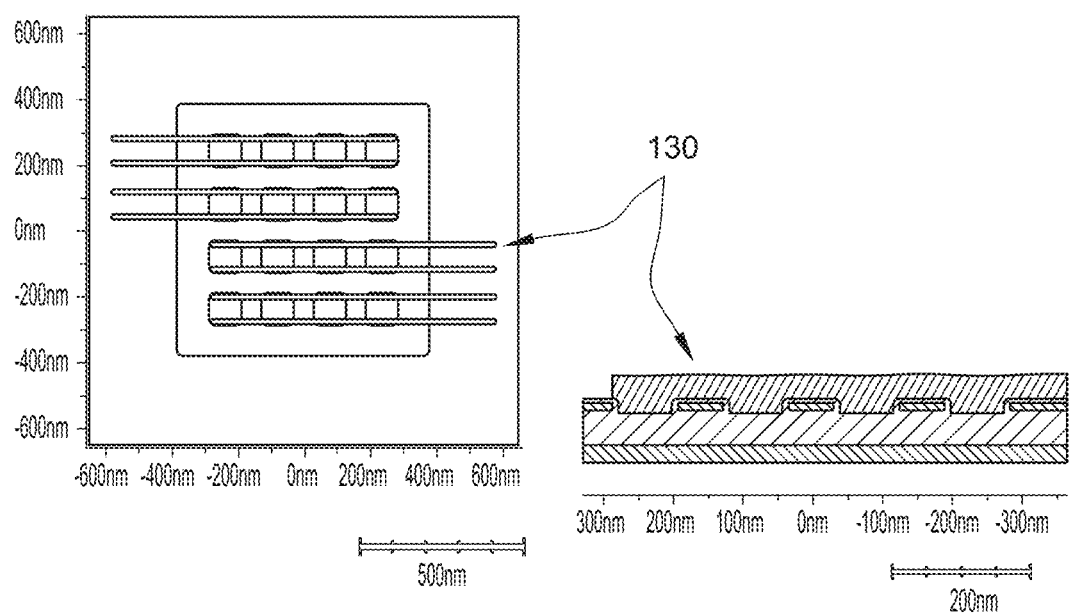
Figure 5G:
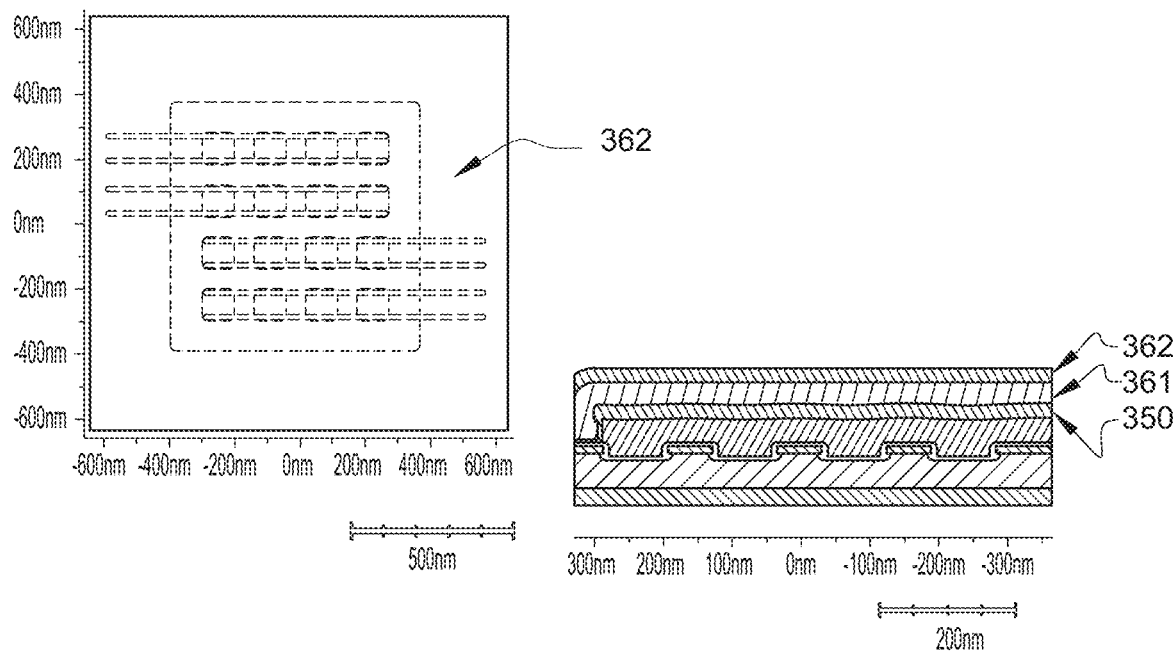
Figure 5H:
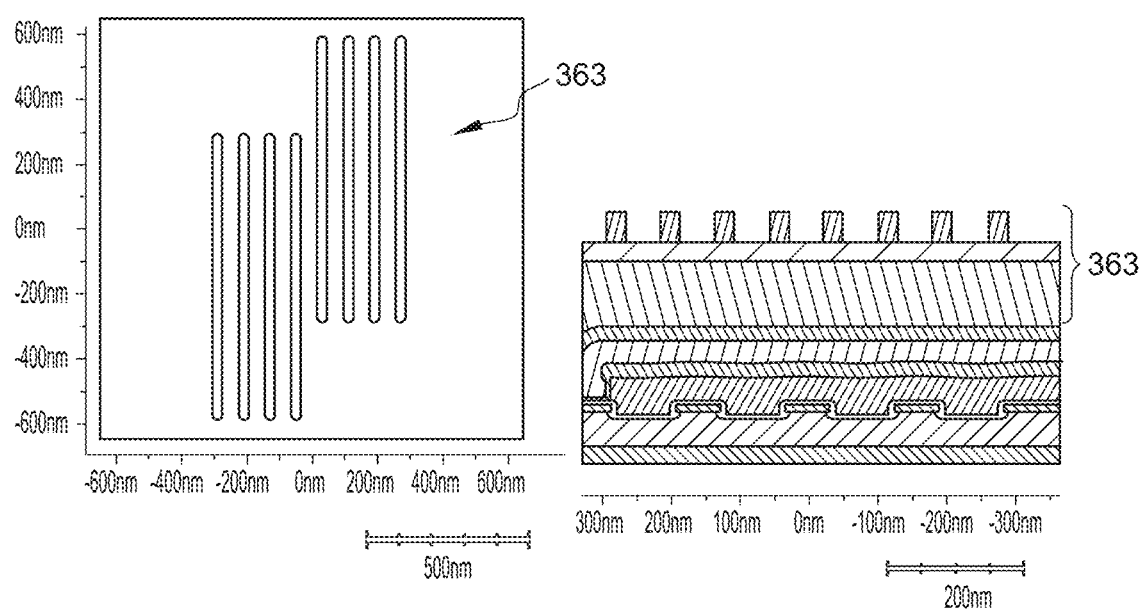
Figure 5I:
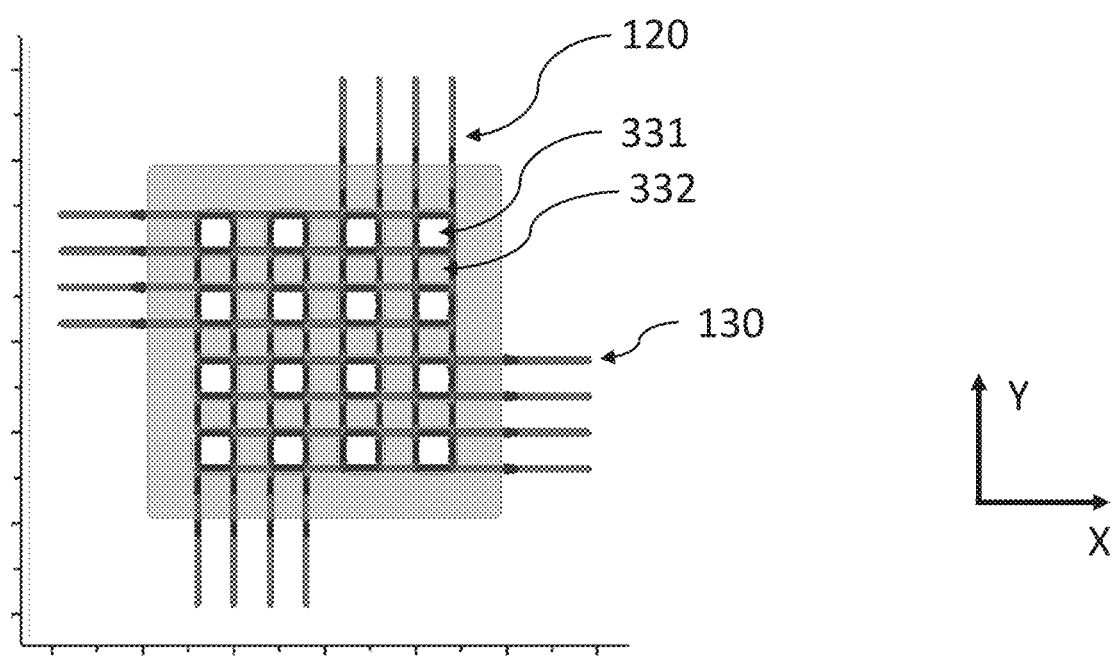

FIGS. 5A to 5I show an example of a method of manufacturing an array of quantum dots such as that shown in FIG. 2B. FIGS. 5A to 5H show a top view and a cross-section view of an array obtained at the end of a same step; FIG. 5I shows a top view of the array obtained at the end of the last step.

The array may be formed from a SOI (Silicon on Insulator) substrate 310 comprising a solid layer 311 of semiconductor, for example, of silicon, under a buried dielectric layer 312, for example, $SiO_2$, under a surface semiconductor layer 313, for example, made of silicon (FIG. 5A).

As a variant, the substrate may be a heterostructure, for example, a substrate comprising a layer or a plurality of layers of SiGe, or any other adapted substrate. It is advantageous for the substrate to have an upper semiconductor layer and a layer of dielectric material under the semiconductor layer.

Then, a first lithography step is carried out, comprising a sub-step of deposition of a resin sensitive to light radiation, or resist 320, on the upper surface of substrate 310, that is, in the considered example, on surface semiconductor layer 313, and a sub-step of light irradiation of resist 320 via a mask (not shown) formed of opaque areas blocking radiations and of transparent areas letting through radiations, thus enabling to define a resist pattern 320 such as shown in FIG. 5B. The holes 321 within the pattern will enable to define the qubit blocking sites of the array of quantum dots.

Advantageously, an oxide layer (not shown) may be formed on the upper surface of substrate 310, prior to the step of deposition of resist 320 on said upper surface of the substrate, to avoid the contact of the resist with the semiconductor, for example, silicon, where the quantum dots will be formed. In this case, this oxide layer has to be removed after the removal of the resist.

As a variant to a single-level photolithography technique such as previously described, a plurality of photolithography levels may be implemented, with a transfer of intermediate patterns in a previously-deposited hard mask, according to the targeted dimensions and the desired hole shapes, particularly when a dense hole mesh is targeted. For example, a multiple-patterning technique, particularly double patterning, may be implemented.

Then, a first etch step etches surface semiconductor layer 313 at the locations where the resist is not present, particularly in holes 321 within the pattern. Resist 320 is then removed, for example, by chemical dissolution or by oxidation.

The obtained structure 330 comprises (FIG. 5C):
  sites made of a dielectric 331, for example, of $SiO_2$, in the areas (particularly in holes 321) where the resist was absent, the semiconductor having been etched down to dielectric layer 312; and
  sites made of a semiconductor 332, for example, of Si, in the areas where the resist was present, the semiconductor of surface semiconductor layer 313 being kept.

All or part of the dielectric sites 331 define the qubit blocking sites of the array of quantum dots, while all or part of the semiconductor sites 332 define the sites where the quantum dots are formed as well as the tunnel barriers of the array of quantum dots.

Two control gate levels 120, 130 are then formed by the implementation of a plurality of steps of deposition, photolithography and etching of conductive materials (for example, polysilicon (Poly-Si) and/or metal gate materials such as titanium nitride (TiN), and of an intermediate step of deposition (between the two gate levels) of a dielectric material to form a dielectric layer between the conductive materials forming the two gate levels, and optionally a step of planarization of the material(s) of the second gate level.

Thus, a first step of deposition of a layer of conductive material 341 (for example TiN and/or Poly-Si) is carried out on structure 330, followed by a first step of deposition of a hard mask 342 (FIG. 5D).

Then, a second lithography step is carried out, comprising a sub-step of deposition of a resist 343 (or of a stack of layers including at least one resist in the upper portion) on hard mask 342, and a sub-step of light irradiation, via a mask (not shown) formed of opaque areas and of transparent areas enabling to define a resist pattern 343 such as shown in FIG. 5E. The shown pattern is formed of a plurality of rows which will enable to define the control gates in rows 130.

Then, a second etch step etches hard mask 342 and the layer of conductive material 341 at the locations where resist 343 is not present, only leaving rows of conductive material defining the row control gates 130 when resist 343, and possibly hard mask 342, are removed, for example by chemical dissolution and/or by oxidation (FIG. 5F). In FIG. 5F, it can be seen that hard mask 342 has been removed but this is not compulsory, it may be kept to simplify the method.

Then, a step of deposition of an intermediate insulation layer 350 (made of a dielectric material) is carried out to form an insulation layer between the conductive material of the control gates in rows 130 and the conductive material of the control gates in columns 120 which are formed at the next steps.

Then, a second step of deposition of a layer of conductive material 361 (for example TiN and/or Poly-Si) is carried out on intermediate insulation layer 350, followed by a second step of deposition of a hard mask 362 (FIG. 5G).

Then, a third photolithography step is carried out, comprising a sub-step of deposition of a resist 363 (or of a stack of layers including at least a resist in the upper portion) on hard mask 362, and a sub-step of light irradiation, via a mask (not shown) formed of opaque areas and of transparent areas enabling to define a resist pattern 363 such as that shown in FIG. 5H. The show pattern is formed of a plurality of columns which will enable to define the control gates in columns 120.

Then, a third etch step etches hard mask 362 and the layer of conductive material 361 at the locations where resist 363 is not present, only leaving columns of conductive material defining the control gates in columns 120 when resist 363, and possibly hard mask 362, are removed, for example by chemical dissolution and/or by oxidation (FIG. 5I).

Thus, the structure shown in FIG. 5I may form an array of quantum dots such as that of FIG. 2B comprising:
- sites made of semiconductor 332 defining the sites where the quantum dots are formed as well as the tunnel barriers of the array of quantum dots;
- semiconductor-less sites (made of a dielectric material) 331 defining the qubit blocking sites of the array of quantum dots;
- control gates in rows 130 above the sites;
- control gates in columns 120 above the control gates in rows 130.

Of course, other methods and/or configurations are possible. For example, the control gates in rows 130 may be arranged above the control gates in columns 120 by inverting the order of the corresponding steps.

To form quantum dots, techniques known by those skilled in the art may be used. Particularly, the forming of reservoirs of charge carriers in portions of the semiconductor layer, the forming of the interconnects between the quantum dots and the control gates, optionally the forming of spacers and of silicide on electric contacts, the electric contacting areas, the routings of signals may be defined by techniques known by those skilled in the art.

To obtain the array of FIG. 3B, those skilled in the art will be capable of adapting the above-described method. Particularly, they will be capable of adapting the resist pattern during the first photolithography step, and of adapting the first etch step to, in particular, form adjacent blocking sites.

Further, one or a plurality of the following options may be provided:
- one or a plurality of additional control gates intended to act on the chemical potential of all or part of the quantum dots; and/or
- at least one upper general control gate (above the array) and/or a lower general control gate (under the array), such a general control gate being intended to facilitate the control of the entire array.

Advantageously, a step of planarization of the last formed gate level, in the example the stack of column control gates 120, may be provided. This enables to facilitate the definition of the second gate level during the etch step, the planarization facilitating the management of the topography induced by the first gate level.

Figure 6A:
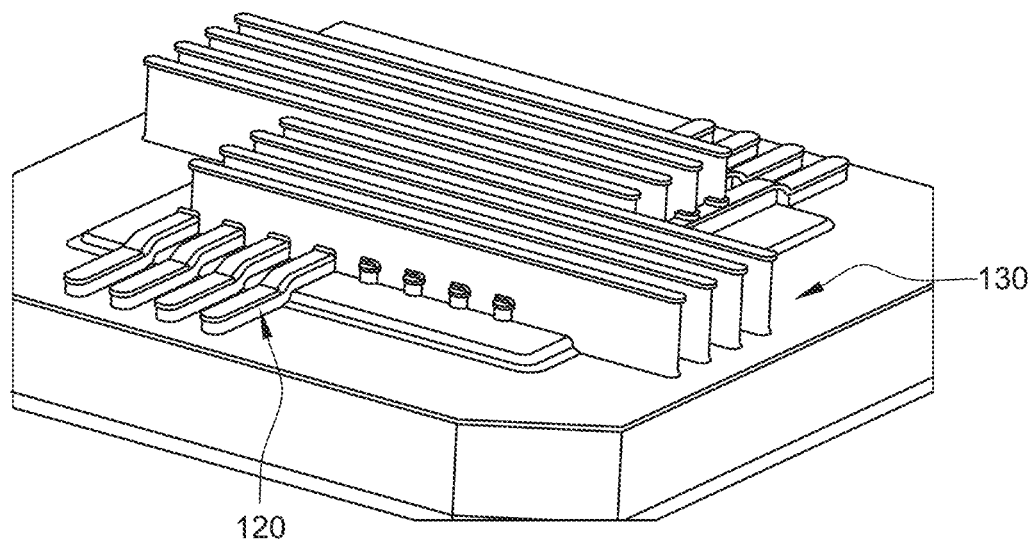
FIG. 6A and FIG. 6B show two variants of a method of manufacturing an array of quantum dots according to an embodiment.
Figure 6B:
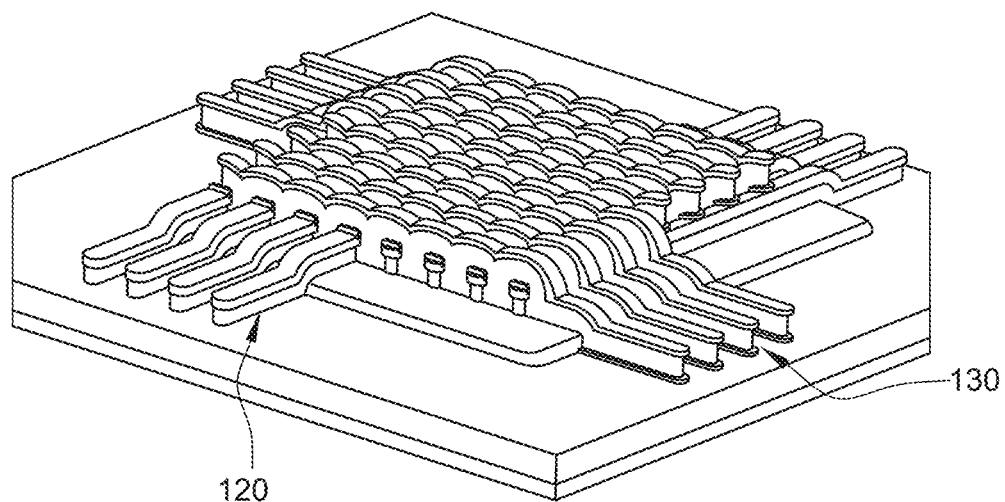

There has been shown in FIG. 6A a first variant of a method of manufacturing an array of quantum dots comprising such a planarization step. There has been shown in FIG. 6B a second variant of a method of manufacturing an array of quantum dots comprising no planarization step, where it can be observed that the second gate level is submitted to the topography of the first gate level.

Various embodiments and variants have been described. Those skilled in the art will understand that certain features of these various embodiments and variants may be combined, and other variants will occur to those skilled in the art. In particular, as an alternative to an array of quantum dots with a square mesh (or paving), an array of quantum dots with a hexagonal mesh (or paving) with blocking sites cleverly arranged between the quantum dots can be envisaged.

Finally, the practical implementation of the described embodiments and variations is within the abilities of those skilled in the art based on the functional indications given hereabove.

The invention claimed is:

1. Quantum device in the form of a two-dimensional array of quantum dots, the array comprising at least two elementary cells extending along a main plane and arranged next to one another in a first direction of the main plane and/or a second direction of the main plane, each elementary cell comprising:
   - a plurality of sites occupied by quantum dots capable of confining at least one spin qubit and comprising at least a first quantum dot, a second quantum dot adjacent to the first quantum dot in the first direction of the main plane, and a third quantum dot adjacent to the first quantum dot in the second direction of the main plane; and
   - at least one blocking site not capable of confining any spin qubit, including a first blocking site adjacent to the second and third quantum dots;

the array thus comprising a plurality of first, second, and third quantum dots and of blocking sites arranged so that all or part of the second quantum dots are arranged between at least two blocking sites in the second direction, and all or part of the third quantum dots are arranged between at least two blocking sites in the first direction.

2. Quantum device according to claim 1, wherein each elementary cell further comprises:
   - a first control gate extending in the second direction and on a first level, said first control gate being capable of sending a signal for controlling a qubit displacement in the first direction by acting on the tunnel barrier separating the first and second quantum dots;
   - a second control gate extending in the first direction and on a second level stacked to the first level, said second control gate being capable of sending a signal for controlling a qubit displacement in the second direction by acting on the tunnel barrier separating the first and third quantum dots.

3. Quantum device according to claim 2, wherein the elementary cells adjacent in the second direction share the same first control gate and/or the elementary cells adjacent in the first direction share the same second control gate.

4. Quantum device according to claim 1, wherein for each elementary cell:
   - the quantum dots further comprise a fourth quantum dot adjacent to the first quantum dot in the direction opposite to the second quantum dot;
   - the at least one blocking site further comprises a second blocking site adjacent to the third and fourth quantum dots;
   - the array thus also comprising a plurality of fourth quantum dots, the quantum dots and the blocking sites being arranged so that all or part of the fourth quantum dots are arranged between at least two blocking sites in the second direction.

5. Quantum device according to claim 4, wherein each elementary cell further comprises:
   - a third control gate extending on the first level parallel to the first control gate, said third control gate being capable of sending a signal for controlling a qubit displacement in the first direction by acting on the tunnel barrier separating the first and fourth quantum dots.

6. Quantum device according to claim 4, wherein, for each elementary cell:
   - the quantum dots further comprise a fifth quantum dot adjacent to the first quantum dot in the second direction opposite to the third quantum dot;
   - the at least one blocking site further comprises a third blocking site adjacent to the second and fifth quantum dots and a fourth blocking site adjacent to the fourth and fifth quantum dots;

the array thus also comprising a plurality of fifth quantum dots, the quantum dots and the blocking sites being arranged so that all or part of the second quantum dots are arranged between at least four blocking sites in the second direction, all or part of the third quantum dots are arranged between at least four blocking sites in the first direction, all or part of the fourth quantum dots are arranged between at least four blocking sites in the second direction, and all or part of the fifth quantum dots are arranged between at least four blocking sites in the first direction.

7. Quantum device according to claim 6, wherein each elementary cell further comprises:
a fourth control gate extending on the second level parallel to the second control gate, said fourth control gate being capable of sending a signal for controlling a qubit displacement in the second direction by acting on the tunnel barrier separating the first and fifth quantum dots.

8. Quantum device according to claim 7, wherein the elementary cells adjacent in the second direction share the same first and third control gates and/or the elementary cells adjacent in the first direction share the same second and fourth control gates.

9. Quantum device according to claim 1, wherein the array comprises:
between two elementary cells adjacent in the first direction, a fifth control gate extending on the first level parallel to the first control gate; and/or
between two elementary cells adjacent in the second direction, a sixth control gate extending on the second level parallel to the second control gate.

10. Quantum device according to claim 1, wherein each quantum dot is a semiconductor nanostructure and each blocking site is a nanostructure at least partially semiconductor-free, for example, comprising a dielectric material.

11. Quantum device according to claim 1, wherein the edges of the quantum dots are coupled to a control gate, and/or the edges of some among the blocking sites, for example, blocking sites on the edges of the array, are not all coupled to a control gate.

12. Method of displacement of qubits in an array of a quantum device according to claim 1, the displacement method comprising:
a step of application of a signal of qubit displacement in the first direction, said signal being applied to an alignment, in the second direction, of quantum dots comprising at least first and third quantum dots, the displacement signal allowing the displacement of a qubit in the first direction from the first quantum dot to a second quantum dot adjacent to the first quantum dot, while the displacement of a qubit from the third quantum dot in the first direction is blocked by a blocking site.

13. Method according to claim 12, further comprising:
prior to the step of application of the displacement signal, a step of displacement in the second direction of at least one qubit from a first quantum dot to a third quantum dot adjacent to said first quantum dot to have the displacement in the first direction of said qubit blocked by the blocking site.

14. Method of manufacturing an array of a quantum device according to claim 1, said manufacturing method comprising:
a step of provision of a substrate having at least one upper layer made of semiconductor material;
a step of forming of blocking sites and of quantum dots, said forming step comprising the removal of the semiconductor material from first areas of the upper semiconductor layer to form a plurality of blocking sites, second areas of the upper semiconductor layer where the semiconductor material is not removed forming a plurality of first, second, and third quantum dots; said forming step being carried out so that each second quantum dot is adjacent to a first quantum dot in a first direction of the main plane, that each third quantum dot is adjacent to a first quantum dot in a second direction of the main plane, and that each blocking site is adjacent to a second quantum dot and a third quantum dot.

15. Method according to claim 14, further comprising:
a step of forming of a first level of control gates extending parallel to one another in the second direction; and
a step of forming of a second level of control gates extending parallel to one another in the first direction; each step of forming of the first and of the second control gate level comprising a step of deposition of a layer of a conductive material, followed by a photolithography step and then an etch step.

* * * * *